US010211139B2

(12) United States Patent
Tseng et al.

(10) Patent No.: US 10,211,139 B2
(45) Date of Patent: Feb. 19, 2019

(54) CHIP PACKAGE STRUCTURE

(71) Applicant: Unimicron Technology Corp., Taoyuan (TW)

(72) Inventors: Tzyy-Jang Tseng, Hsinchu (TW); Yu-Hua Chen, Hsinchu (TW); Ra-Min Tain, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 177 days.

(21) Appl. No.: 15/287,729

(22) Filed: Oct. 6, 2016

(65) Prior Publication Data

US 2017/0025342 A1 Jan. 26, 2017

Related U.S. Application Data

(60) Continuation-in-part of application No. 14/995,207, filed on Jan. 14, 2016, now Pat. No. 9,831,103, which (Continued)

(30) Foreign Application Priority Data

May 24, 2012 (TW) ............................ 101118578 A

(51) Int. Cl.
*H01L 23/498* (2006.01)
*H01L 23/48* (2006.01)
(Continued)

(52) U.S. Cl.
CPC ........ *H01L 23/49833* (2013.01); *C25D 5/022* (2013.01); *C25D 5/34* (2013.01);
(Continued)

(58) Field of Classification Search
CPC .................................................... H01L 21/486
See application file for complete search history.

(56) References Cited

U.S. PATENT DOCUMENTS 7,446,419 B1 * 11/2008 Lin ....................... H01L 21/568 257/777
8,310,051 B2 11/2012 Chen et al.
(Continued)

FOREIGN PATENT DOCUMENTS

CN 1507046 6/2004
CN 102157391 8/2011
(Continued)

OTHER PUBLICATIONS

"Office Action of Taiwan Counterpart Application", dated Dec. 6, 2016, p. 1-p. 6.

*Primary Examiner* — Mounir S Amer
(74) *Attorney, Agent, or Firm* — JCIPRNET

(57) ABSTRACT

A chip package structure including a molding compound, a carrier board, a chip, a plurality of conductive pillars and a circuit board is provided. The carrier board includes a substrate and a redistribution layer. The substrate has a first surface and a second surface. The redistribution layer is disposed on the first surface. The chip and the conductive pillars are disposed on the redistribution layer. The molding compound covers the chip, the conductive pillars, and the redistribution layer. The circuit board is connected with the carrier board, wherein the circuit board is disposed on the molding compound, such that the chip is located between the substrate and the circuit board, and the chip and the redistribution layer are electrically connected with the circuit board through the conductive pillars. Heat generated by the chip is transmitted through the substrate from the first surface to the second surface to dissipate.

7 Claims, 8 Drawing Sheets

132 126a 126a 132 130 129 126 128 124 172 170 S1 110 112 120a 122b 160 122a 122 S2 129' 180 126' 128' 124' 150 122a 110' 112' S1' 122' 140 S2' 120

100b

Related U.S. Application Data is a division of application No. 14/164,245, filed on Jan. 26, 2014, now Pat. No. 9,282,646, which is a continuation-in-part of application No. 13/543,893, filed on Jul. 9, 2012, now Pat. No. 8,952,268.

(51) Int. Cl.

| | |
|---|---|
| ***H01L 25/10*** | (2006.01) |
| ***H01L 21/48*** | (2006.01) |
| ***H01L 23/367*** | (2006.01) |
| ***H01L 23/31*** | (2006.01) |
| ***C25D 5/02*** | (2006.01) |
| ***C25D 5/34*** | (2006.01) |
| ***C25D 5/48*** | (2006.01) |
| ***C25D 7/12*** | (2006.01) |
| ***H05K 1/11*** | (2006.01) |
| ***H05K 3/46*** | (2006.01) |
| ***H01L 23/36*** | (2006.01) |
| *H05K 3/42* | (2006.01) |

(52) U.S. Cl.

CPC ................. *C25D 5/48* (2013.01); *C25D 7/12* (2013.01); *H01L 21/486* (2013.01); *H01L 21/4857* (2013.01); *H01L 23/3128* (2013.01); *H01L 23/36* (2013.01); *H01L 23/481* (2013.01); *H01L 23/49827* (2013.01); *H01L 23/49838* (2013.01); *H01L 25/105* (2013.01); *H05K 1/113* (2013.01); *H05K 3/4647* (2013.01); *C25D 7/123* (2013.01); *H01L 2224/16225* (2013.01); *H01L 2225/1023* (2013.01); *H01L 2225/1041* (2013.01); *H01L 2225/1058* (2013.01); *H01L 2225/1094* (2013.01); *H05K 3/424* (2013.01); *H05K 3/4682* (2013.01); *H05K 2201/10378* (2013.01); *H05K 2203/0152* (2013.01); *H05K 2203/0733* (2013.01); *Y10T 29/49155* (2015.01)

(56) References Cited

U.S. PATENT DOCUMENTS

| | | | | |
|---|---|---|---|---|
| 9,368,442 | B1 | 6/2016 | Tain et al. | |
| 2008/0237847 | A1* | 10/2008 | Nakanishi ............. | H01L 23/473 257/722 |
| 2008/0290496 | A1* | 11/2008 | Park .................... | H01L 21/6835 257/693 |
| 2010/0019379 | A1* | 1/2010 | Zhao ................... | H01L 21/4871 257/713 |
| 2010/0133704 | A1* | 6/2010 | Marimuthu ........... | H01L 21/565 257/778 |
| 2012/0013022 | A1* | 1/2012 | Sabuncuoglu Tezcan .................. | H01L 21/7682 257/774 |
| 2015/0021754 | A1 | 1/2015 | Lin et al. | |

FOREIGN PATENT DOCUMENTS

| | | |
|---|---|---|
| TW | 201230937 | 7/2012 |
| TW | 201308538 | 2/2013 |
| TW | 201347132 | 11/2013 |
| TW | 201409771 | 3/2014 |

* cited by examiner

CHIP PACKAGE STRUCTURE

CROSS-REFERENCE TO RELATED APPLICATION

This application is a continuation-in-part application of and claims the priority benefit of U.S. application Ser. No. 14/995,207, filed on Jan. 14, 2016, now pending. The prior U.S. application Ser. No. 14/995,207 is a divisional application of and claims the priority benefit of U.S. application Ser. No. 14/164,245, filed on Jan. 26, 2014, now patented as U.S. Pat. No. 9,282,646. The prior U.S. application Ser. No. 14/164,245 is a continuation-in-part application of and claims the priority benefit of U.S. application Ser. No. 13/543,893, filed on Jul. 9, 2012, now patented as U.S. Pat. No. 8,952,268, which claims the priority benefit of Taiwan application serial no. 101118578, filed on May 24, 2012. The entirety of each of the above-mentioned patent applications is hereby incorporated by reference herein and made a part of specification.

BACKGROUND OF THE INVENTION

[Field of the Invention]

The invention relates to a package structure and more particularly relates to a chip package structure.

[Description of Related Art]

In recent years, as the demand for electronic products with high functionality, high-speed signal transmission, and high circuit component density surged, the semiconductor-related industries have developed rapidly. The semiconductor integrated circuit (IC) industry includes IC manufacturing and IC packaging. IC manufacturing is to fabricate an integrated circuit on a wafer. IC packaging may provide a chip having an integrated circuit thereon (i.e., a portion cut from the wafer) with structural protection, electrical transmission, and favorable heat dissipation.

Flip-chip bonding technology is a chip packaging technology and is usually used for bonding between a chip and a carrier board. Specifically, an active surface (generally, referring to a surface with an active device thereon) of the chip may be connected with a top surface of the carrier board through multiple conductive bumps. Then, a bottom surface of the carrier board may be connected with a circuit board (e.g., a printed circuit board) through conductive bumps. However, the method described above may easily cause the heat generated during operation of the chip to be accumulated between the chip, the carrier board, and the circuit board.

SUMMARY OF THE INVENTION

The invention provides a chip package structure that achieves favorable heat dissipation efficiency.

The chip package structure of the invention includes at least one molding compound, at least one carrier board, at least one chip, at least one conductive pillar, and a circuit board. The carrier board includes a substrate and a redistribution layer. The substrate has a first surface and a second surface opposite to each other. The redistribution layer is disposed on the first surface of the substrate, and the chip is disposed on the redistribution layer. The conductive pillar is disposed on the redistribution layer and located at a periphery of the chip. The molding compound is disposed on the redistribution layer and covers the chip, the conductive pillar, and the redistribution layer. The conductive pillar passes through the molding compound. The circuit board is connected with the carrier board through the conductive pillar, and the circuit board is disposed on the molding compound, such that the chip is located between the substrate and the circuit board. The chip and the redistribution layer are electrically connected with the circuit board through the conductive pillar. Heat generated by the chip is transmitted through the substrate from the first surface to the second surface to be dissipated.

Based on the above, in the chip package structure of the invention, the chip, the conductive pillars, and the redistribution layer of the carrier board are disposed on the first surface of the substrate of the carrier board and are covered by the molding compound, and then the circuit board is disposed on the molding compound such that the chip is located between the substrate and the circuit board, and the chip and the redistribution layer are electrically connected with the circuit board through the conductive pillars. Thus, according to the invention, as compared with the conventional technology in which the chip and the carrier board are sequentially disposed on the circuit board, the heat generated by the chip during operation is transmitted through the substrate from the first surface to the second surface to be dissipated and is not accumulated between the chip and the circuit board. Accordingly, the invention provides a chip package structure that achieves favorable heat dissipation efficiency.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
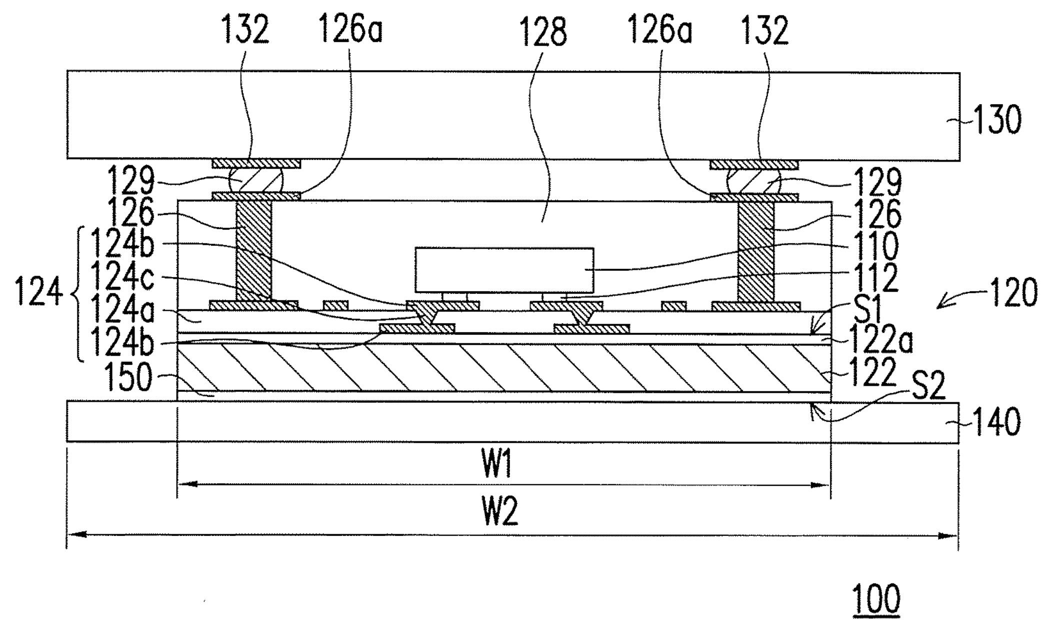
FIG. 1 is a schematic view of a chip package structure according to the first embodiment of the invention.

FIG. 1 is a schematic view of a chip package structure according to the first embodiment of the invention. Referring to FIG. 1, in this embodiment, a chip package structure 100 includes a molding compound 128, a carrier board 120, a chip 110, a plurality of conductive pillars 126, and a circuit board 130. The molding compound 128 includes the chip 110 and the conductive pillars 126, wherein the chip 110 includes a plurality of conductive bumps 112. The carrier board 120 includes a substrate 122 and a redistribution layer 124. The substrate 122 has a first surface S1 and a second surface S2 opposite to each other. The redistribution layer 124 is disposed on the first surface S1 of the substrate 122, and the chip 110 is disposed on the redistribution layer 124. The conductive pillars 126 are disposed on the redistribution layer 124 and located at a periphery of the chip 110. The molding compound 128 is disposed on the redistribution layer 124, wherein the molding compound 128 covers the chip 110, the conductive pillars 126, and the redistribution layer 124, and the conductive pillars 126 pass through the molding compound 128. The circuit board 130 is connected with the carrier board 120 through the conductive pillar 126, wherein the circuit board 130 is disposed on the molding compound 128, such that the chip 110 is located between the substrate 122 and the circuit board 130, and the chip 110 and the redistribution layer 124 are electrically connected with the circuit board 130 through the conductive pillars 126. Heat generated by the chip 110 is transmitted through the substrate 122 from the first surface S1 to the second surface S2 to be dissipated. Accordingly, the chip package structure 100 achieves favorable heat dissipation efficiency.

Specifically, in this embodiment, a fabricating method and details of the structure of the chip package structure 100 are as follows: first, the substrate 122 is provided. A material of the substrate 122 may include glass, ceramics, a polymer material, or silicon, and preferably a highly thermal conductive material is used, such as poly-silicon, silicon carbide (SiC), graphene, aluminium nitride (AlN), or other suitable materials. In this embodiment, the substrate 122 includes poly-silicon, for example, but the invention is not limited thereto.

Next, in this embodiment, the redistribution layer 124 is disposed on the first surface S1 of the substrate 122. The redistribution layer 124 may be a multi-layer circuit, which includes a dielectric layer 124*a*, two patterned circuits 124*b* disposed on two opposite sides of the dielectric layer 124*a*, and a conductive hole 124*c* passing through the dielectric layer 124*a* to connect the two patterned circuits 124*b*, for example. However, in some other embodiments not shown here, the redistribution layer 124 may be a single-layer circuit or a multi-layer circuit having other configurations. Nevertheless, the invention is not limited to the above. Moreover, if the substrate 122 is electrically conductive (for example, poly-silicon is used), a dielectric layer 122*a* is required between the first surface S1 of the substrate 122 and the redistribution layer 124, so as to isolate the redistribution layer 124 formed on the first surface S1 of the substrate 122. Then, the chip 110 is disposed on the redistribution layer 124. The chip 110 is disposed on the patterned circuits 124*b* of the redistribution layer 124 through the conductive bumps 112 to be electrically connected with the redistribution layer 124.

Thereafter, in this embodiment, the conductive pillars 126 are disposed on the redistribution layer 124 at the periphery of the chip 110, and the molding compound 128 covers the chip 110 and the redistribution layer 124 and further covers the conductive pillars 126. The conductive pillar 126 is a copper pillar, for example, which is disposed on the patterned circuit 124*b* of the redistribution layer 124 to be electrically connected with the redistribution layer 124. The conductive pillars 126 pass through the molding compound 128 to be exposed outside the molding compound 128, and the exposed surfaces (not shown in the figure) of the conductive pillars 126 are even with a surface (not shown in the figure) of the molding compound 128. The conductive pillars 126 and the molding compound 128 may be formed together as an interposed substrate as shown in FIG. 3A to FIG. 3K described after and then be disposed on the redistribution layer 124 and covers the chip 110. However, in some other embodiments not shown in figures, the conductive pillars 126 may be disposed on the redistribution layer 124 first, and then the molding compound 128 is disposed to cover the chip 110, the conductive pillars 126 and the redistribution layer 124. Or, the molding compound 128 may be disposed to cover the chip 110 and the redistribution layer 124 first, and then through holes are formed in the molding compound 128 to communicate with the redistribution layer 124, and a conductive material is filled into the through holes to form the conductive pillars 126 that pass through the molding compound 128. The conductive pillars 126 are distributed and disposed on two opposite sides or on one side at the periphery of the chip 110. Therefore, the invention is not intended to limit the formation, sequence, and positions of the conductive pillars 126, which may be adjusted as required.

Next, in this embodiment, the circuit board 130 is connected with the carrier board 120 through the conductive pillar 126. The circuit board 130 is disposed on the molding compound 128, such that the chip 110 is located between the substrate 122 and the circuit board 130. More specifically, the molding compound 128 further includes a plurality of conductive bumps 129 that are disposed on the conductive pillars 126 or on electrical contact pads 126*a* on the conductive pillars 126 to be electrically connected with the circuit board 130 (for example, connected with conductive pads 132 on the circuit board 130). However, in some other embodiments not shown here, the carrier board 120 may be connected with the circuit board 130 in other suitable manners, not limited to using the conductive bumps 129. Accordingly, the chip 110 and the redistribution layer 124 are electrically connected with the circuit board 130 through the conductive pillars 126, such that an electrical signal generated by the chip 110 may be transmitted to the circuit board 130 through the redistribution layer 124 and the conductive pillars 126. In addition, because the chip 110 and the circuit board 130 are both located on the first surface S1 of the substrate 122, and the second surface S2 of the substrate 122 faces outside, thus the heat generated by the chip 110 during operation is transmitted through the substrate 122 from the first surface S1 to the second surface S2 to be dissipated and is not accumulated between the chip 110 and the circuit board 130. Accordingly, the chip package structure 100 achieves favorable heat dissipation efficiency.

Figure 2:
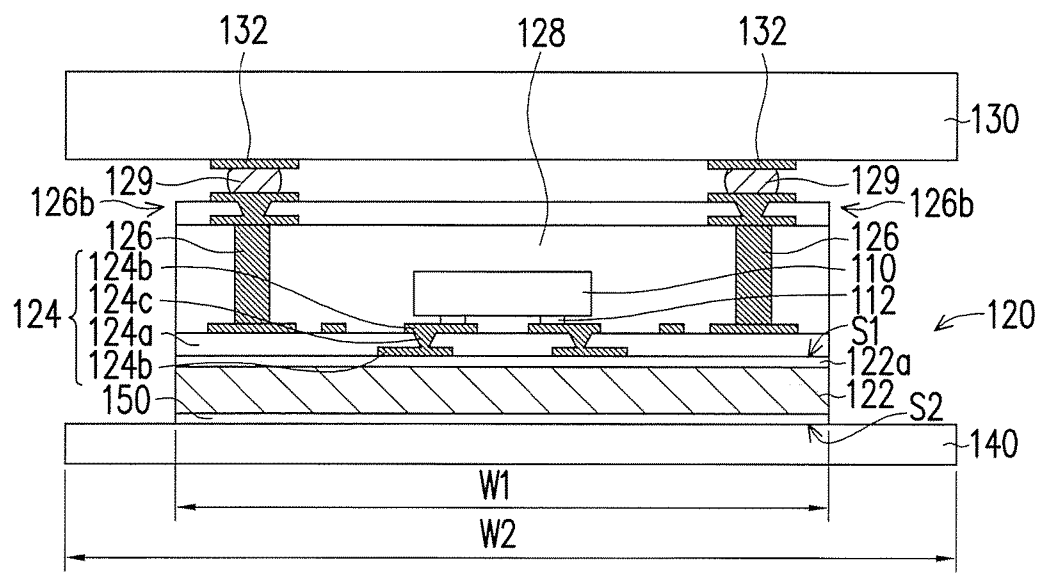
FIG. 2 is a schematic view of a chip package structure according to the second embodiment of the invention.

Moreover, a redistribution layer 126*b* as shown in FIG. 2 may be disposed in place of the electrical contact pads 126*a* of FIG. 1. Referring to FIG. 2, FIG. 2 is a schematic view of a chip package structure according to the second embodiment of the invention. A main difference between FIG. 2 and FIG. 1 is that the redistribution layer 126*b* is disposed in place of the electrical contact pads 126*a*, and the conductive bumps 129 are disposed on the redistribution layer 126*b* on the conductive pillars 126 to be electrically connected with the circuit board 130. The redistribution layer 126*b* may be a multi-layer circuit, which includes a dielectric layer, two patterned circuits disposed on two opposite sides of the dielectric layer, and a conductive hole passing through the dielectric layer to connect the two patterned circuits, as described above. However, the redistribution layer 126*b* may also be a single-layer circuit or a multi-layer circuit having other configurations. Further, although the conductive bumps 129 and the conductive pillars 126 are aligned with each other in FIG. 1 and FIG. 2, the conductive bumps 129 and the conductive pillars 126 may not be aligned with each other as required and be electrically connected through the electrical contact pads 126*a* of FIG. 1 or the redistribution layer 126*b* of FIG. 2. Thus, in the invention, the conductive bumps 129 and the conductive pillars 126 are not necessarily disposed corresponding to one another, which may be adjusted as required. In some other embodiments, the electrical contact pads 126*a* of FIG. 1 or the redistribution layer 126*b* of FIG. 2 may be omitted for directly disposing the conductive bumps 129 on the conductive pillars 126 to achieve electrical connection. Nevertheless, the invention is not limited thereto.

FIG. 3A to FIG. 3K are schematic views showing a process of fabricating an interposed substrate for the chip package structure of FIG. 2. The interposed substrate comprises the conductive pillars 126, the redistribution layer 126*b* and the molding compound 128 aforementioned, but the invention is not limited thereto.

Figure 3A:
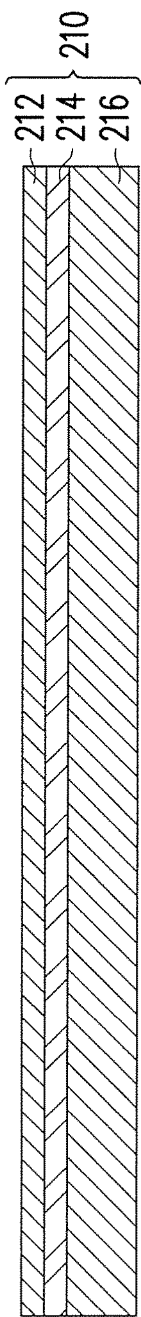
FIG. 3A to FIG. 3K are schematic views showing a process of fabricating an interposed substrate for the chip package structure of FIG. 2.

Firstly, referring to FIG. 3A, a carrier substrate 210 is provided, wherein the carrier substrate 210 may be a metal-stacked layer including a first metal layer 212, a second metal layer 216 and an etching stop layer 214 disposed between the first metal layer 212 and the second metal layer 214. However, in other embodiment, the carrier substrate 210 may be a metal-stacked layer with other compositions or may be other kind of substrate, the invention is not limited thereto.

Figure 3B:
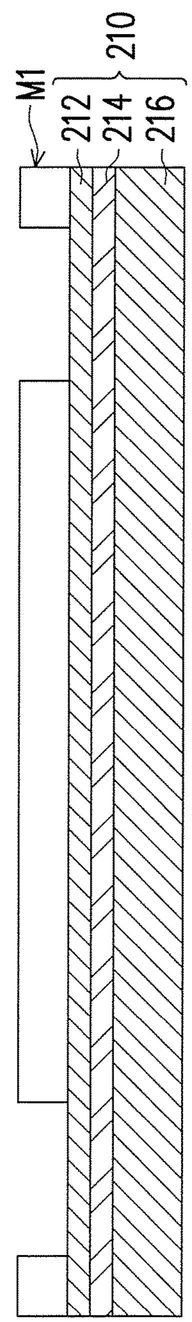
Figure 3C:
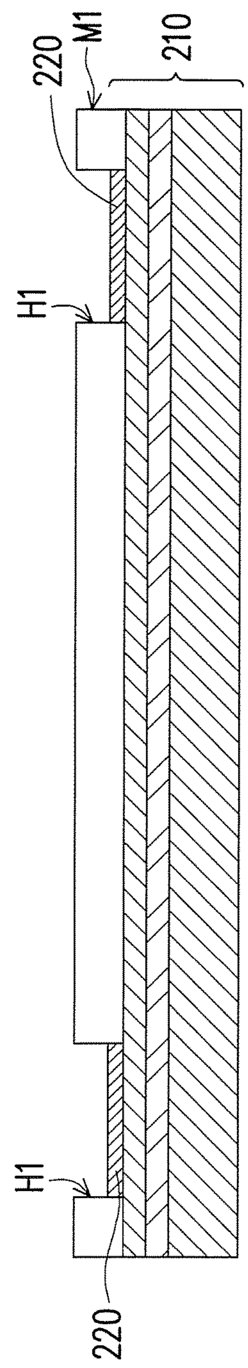
Figure 3D:
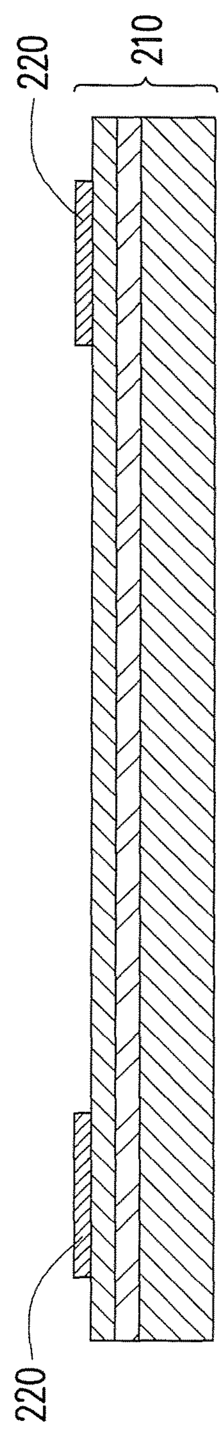

Next, referring to FIG. 3B, a photoresist layer M1 is formed on the carrier substrate 210, wherein the photoresist layer M1 covers a portion of the carrier substrate 210 and has a plurality of openings H1, and the other portion of the carrier substrate 210 is exposed by the openings H1. Then, referring to FIG. 3C, a patterned conductor layer 220 is formed on the carrier substrate 210, wherein the patterned conductor layer 220 is electroplated at the other portion of the carrier substrate 210 exposed by the openings H1 through utilizing the photoresist layer M1 as an electroplating mask. Herein, a material of the patterned conductor layer 220 is, for example copper, nickel or gold, but the invention is not limited thereto. After that, referring to FIG. 3D, the photoresist layer M1 is removed to expose the portion of the carrier substrate 210.

Figure 3E:
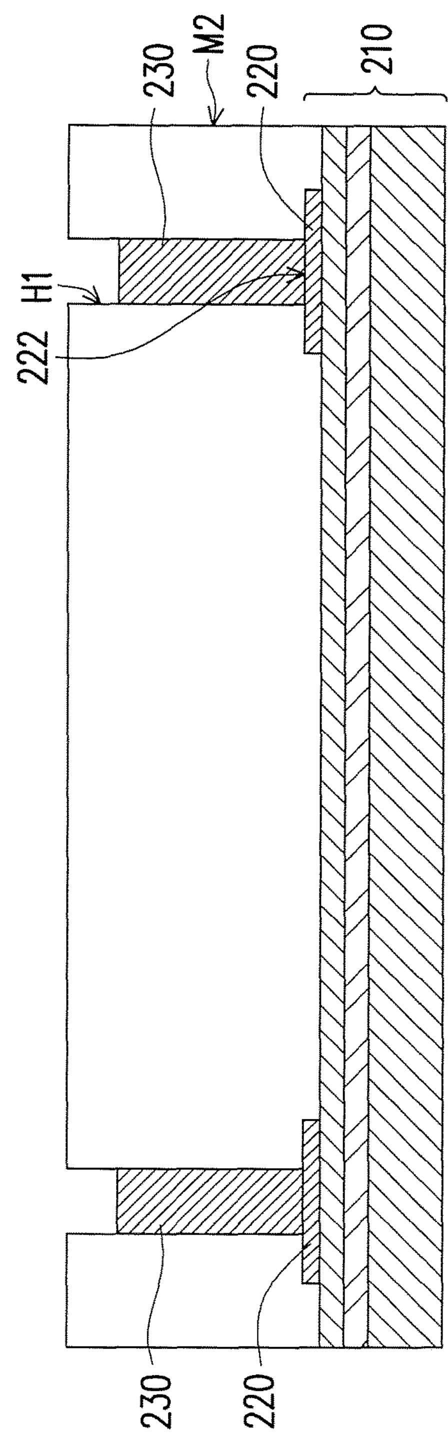
Figure 3F:
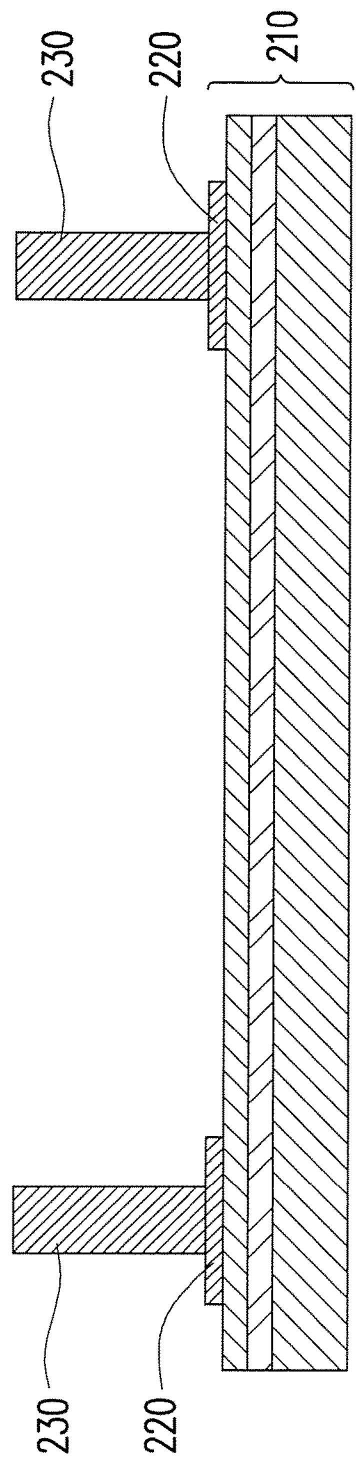

Next, referring to FIG. 3E, a photoresist layer M2 is formed on the carrier substrate 210, wherein the photoresist layer M2 covers the portion of the carrier substrate 210 and has a plurality of openings H2, and the portion of the patterned conductor layer 220 is exposed by the openings H2. And then, still referring to FIG. 3E, the conductive pillars 230 are electroplated in the openings H2 through utilizing the photoresist layer M2 as an electroplating mask, wherein the conductive pillars 230 are separated from each other and stacked on a portion of the patterned conductor layer 220, and a material of the conductive pillars 230 is, for example copper, nickel or gold, but the invention is not limited thereto. Further, an orthogonal projection area of each of the conductive pillars 230 on an upper surface 222 of the corresponding patterned conductor layer 220 is overlapped with and smaller than a surface area of the upper surface 222 of the corresponding patterned conductor layer 220. After that, referring to FIG. 3F, the photoresist layer M2 is removed to expose the portion of the carrier substrate 210.

Figure 3G:
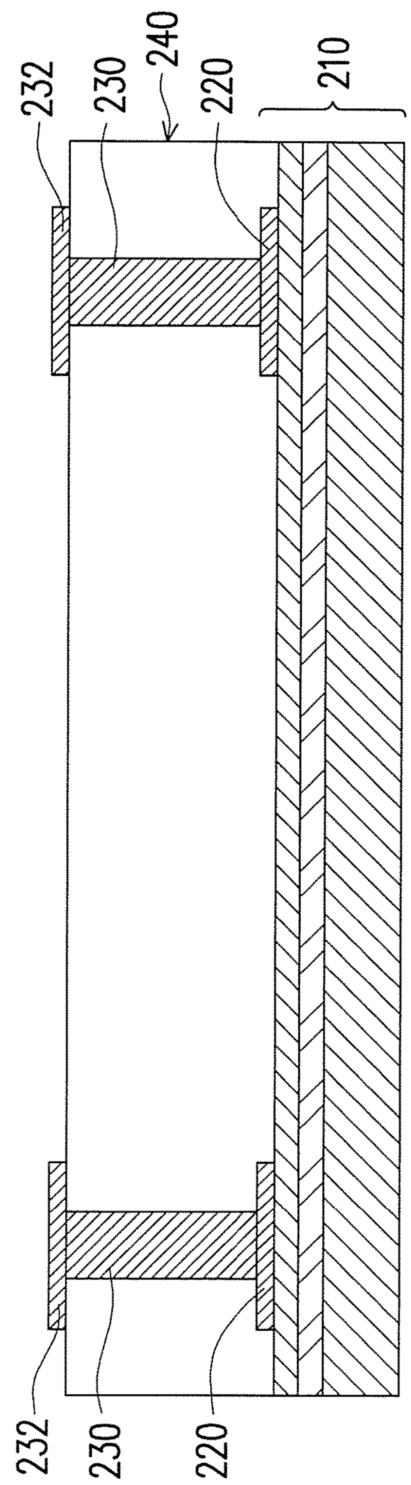

Next, referring to FIG. 3G, an insulating material layer 240 is forming on the carrier substrate 210 through a thermal pressing process, wherein the insulating material layer 240 covers the portion of the carrier substrate 210 and encapsulates the conductive pillars 230 and the other portion of the patterned conductor layer 220. A material of the insulating material layer 240 is, for example, molding compound, ajinomoto build-up film (ABF) resin or silicon dioxide ($SiO_2$), but the invention is not limited thereto. Further, still referring to FIG. 3G, conductive pads 232 may be formed on the insulating material layer 240 and connected with the corresponding conductive pillars 230, but the invention is not limited thereto.

Figure 3H:
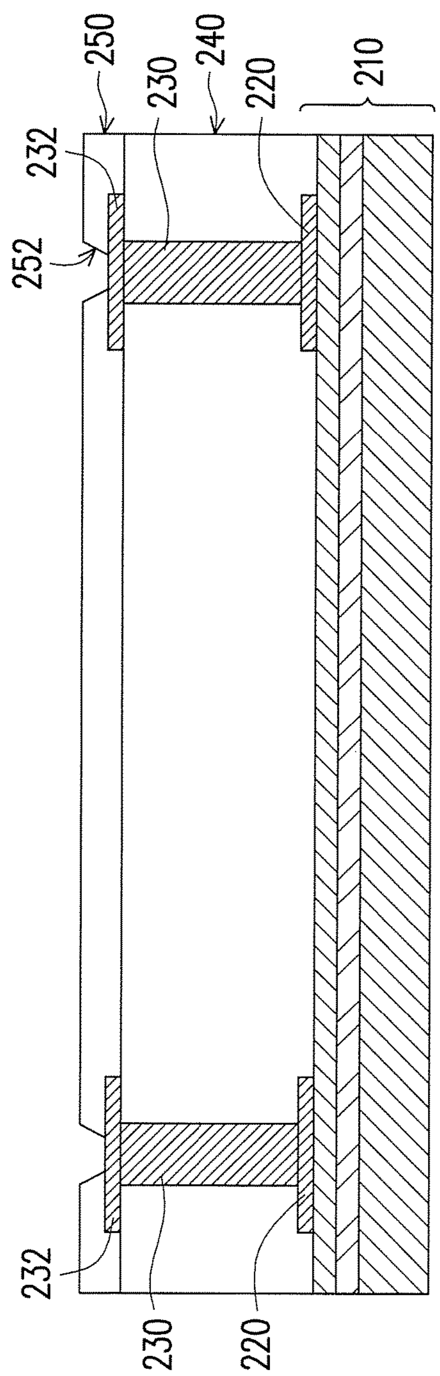

Next, referring to FIG. 3H, a dielectric layer 250 is formed on the insulating material layer 240 after the insulating material layer 240 is forming on the carrier substrate 210. The dielectric layer 250 covers the upper surface 242 of the insulating material layer 240 and the conductive pillars 230 (including the conductive pads 232). Herein, a thickness of the dielectric layer 250 is smaller than a thickness of the insulating material 240. And then, still referring to FIG. 3H, a plurality of through vias 252 is formed and penetrate through the dielectric layer 250 to respectively expose a portion of the conductive pillar 230 (such as the conductive pads 232).

Figure 3I:
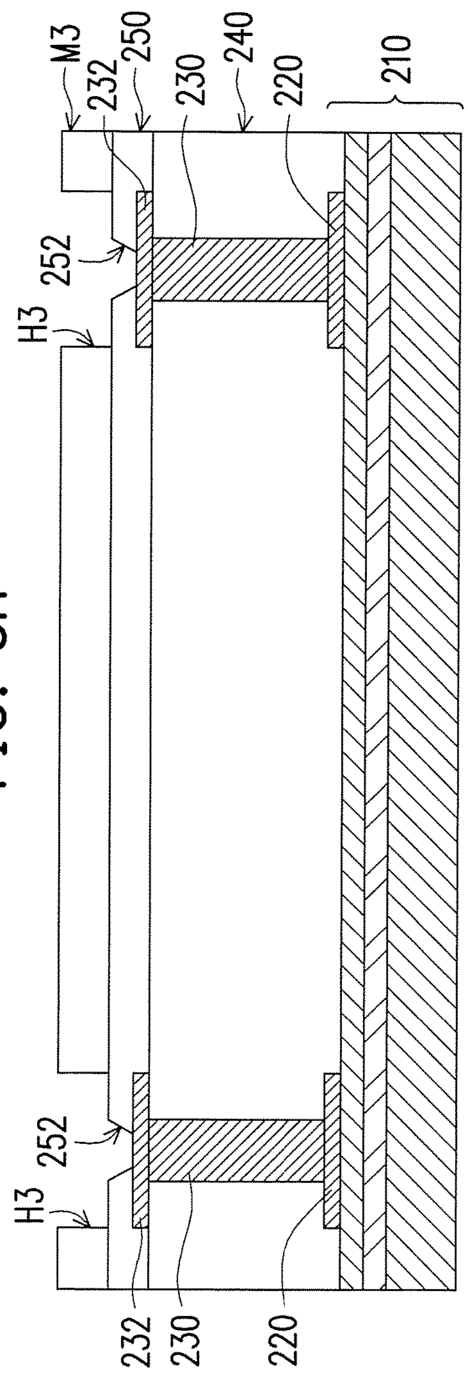
Figure 3J:
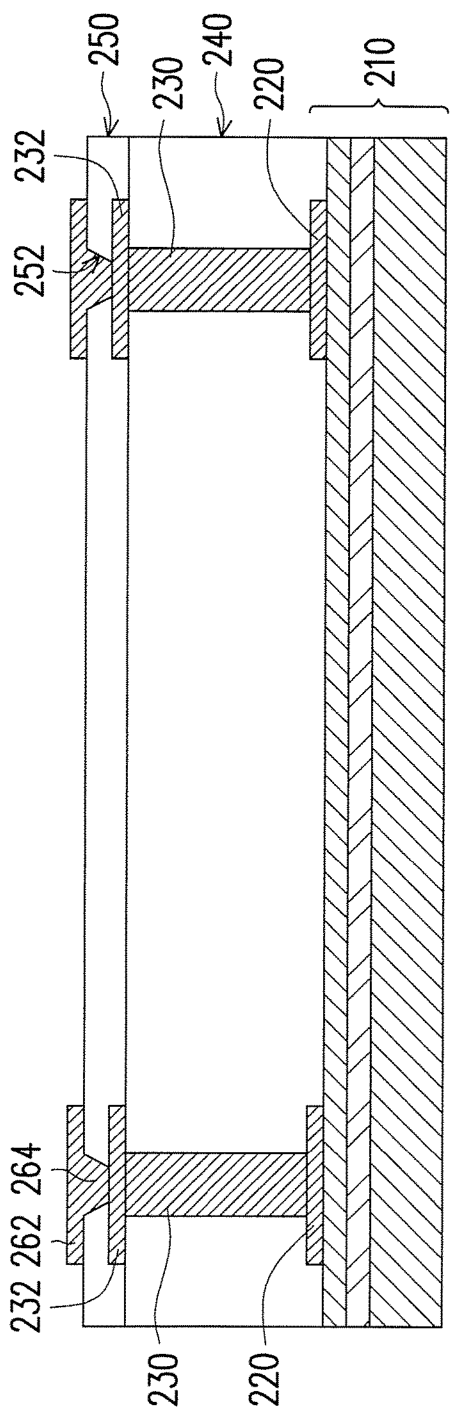

Next, referring to FIG. 3I, a photoresist layer M3 is formed on the dielectric layer 250, wherein the photoresist layer M3 covers a portion of the dielectric layer 250 and has a plurality of openings H3, and the other portion of the dielectric layer 250 and the through vias 252 are exposed by the openings H3. Further, referring to FIG. 3I and FIG. 3J, a plurality of conductive pads 262 and a plurality of conductive through vias 264 are electroplated at the other portion of the dielectric layer 250 exposed by the openings H3 through utilizing the photoresist layer M3 as an electroplating mask, wherein the conductive pads 262 are disposed on the dielectric layer 250, the conductive through vias 264 are respectively located in the through vias 252, and the conductive pads 262 are respectively connected with the corresponding conductive through vias 264 and electrically connect with the corresponding conductive pads 232 and the corresponding conductive pillars 230. Herein, a material of the redistribution layer is, for example, copper, nickel or gold, but the invention is not limited thereto. After that, still referring to FIG. 3J, the photoresist layer M3 is removed to expose the portion of the dielectric layer 250. In this way, the combination of the conductive pads 232 and 262, the conductive through vias 264 and the dielectric layer 250 may consider as a redistribution layer disposed on the insulating material 240. However, the composition of the redistribution layer may be chosen according to need. For example, the redistribution layer may only include the conductive pads 232 without the conductive pads 262, the conductive through vias 264 and the dielectric layer 250 or may take other compositions, but the invention is not limited thereto.

Figure 3K:
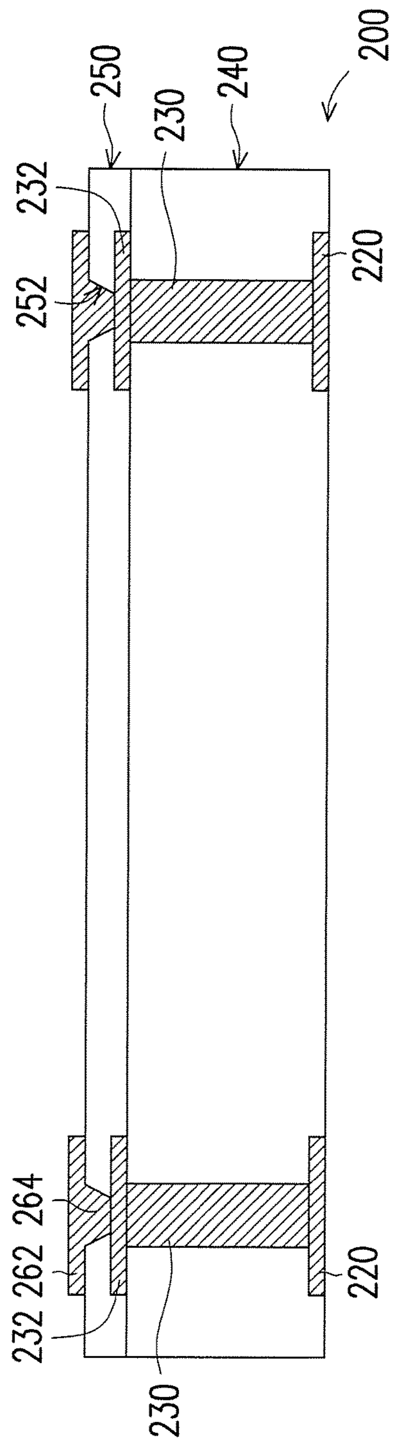

Next, referring to FIG. 3K, the carrier substrate 210 is removed to expose the insulating material layer 240 and the patterned conductor layer 220. After that, the process is completed to form the interposed substrate 200, wherein the interposed substrate 200 comprises the insulating material layer 240, the conductive pillars 230 and the redistribution layer (including the conductive pads 232 and 262, the conductive through vias 264 and the dielectric layer 250), which is adapted to be served as the molding compound 128, the conductive pillars 126 and the redistribution layer 126*b* aforementioned and shown in FIG. 2, and then the interposed substrate 200 is adapted to be disposed on the redistribution layer 124 and covers the chip 110. Moreover, the aforementioned steps (omitting the step of forming the redistribution layer including the conductive pads 262, the conductive through vias 264 and the dielectric layer 250) may also be used to form the interposed substrate shown in FIG. 1 including the molding compound 128, the conductive pillars 126 and the electrical contact pads 126*a*, but the invention is not limited thereto.

Furthermore, besides using the highly thermal conductive substrate 122 described above, other heat dissipation members may be used to facilitate heat dissipation, so as to improve the heat dissipation efficiency of the chip package structure 100. For example, in this embodiment, the chip package structure 100 further includes a heat sink 140 disposed on the second surface S2 of the substrate 122. A thermal interface material (TIM) 150 is further disposed on the second surface S2 of the substrate 122 to facilitate bonding of the heat sink 140. Nevertheless, the invention is not limited thereto. Accordingly, the heat generated by the chip 110 during operation is transmitted through the substrate 122 from the first surface S1 to the second surface S2 and then transmitted to the heat sink 140 through the thermal interface material 150, so as to be dissipated through the heat sink 140. Preferably, a size of the heat sink 140 (e.g., a width W1 in FIG. 1) is larger than a size of the substrate 122 (e.g., a width W2 in FIG. 1) for quickly dissipating the heat of the chip 110 through the large-area heat sink 140. Accordingly, the chip package structure 100 achieves favorable heat dissipation efficiency. Nevertheless, it should be noted that the invention is not intended to limit the size of the heat sink 140 or whether the heat sink 140 is disposed, which may be adjusted as required.

Figure 4:
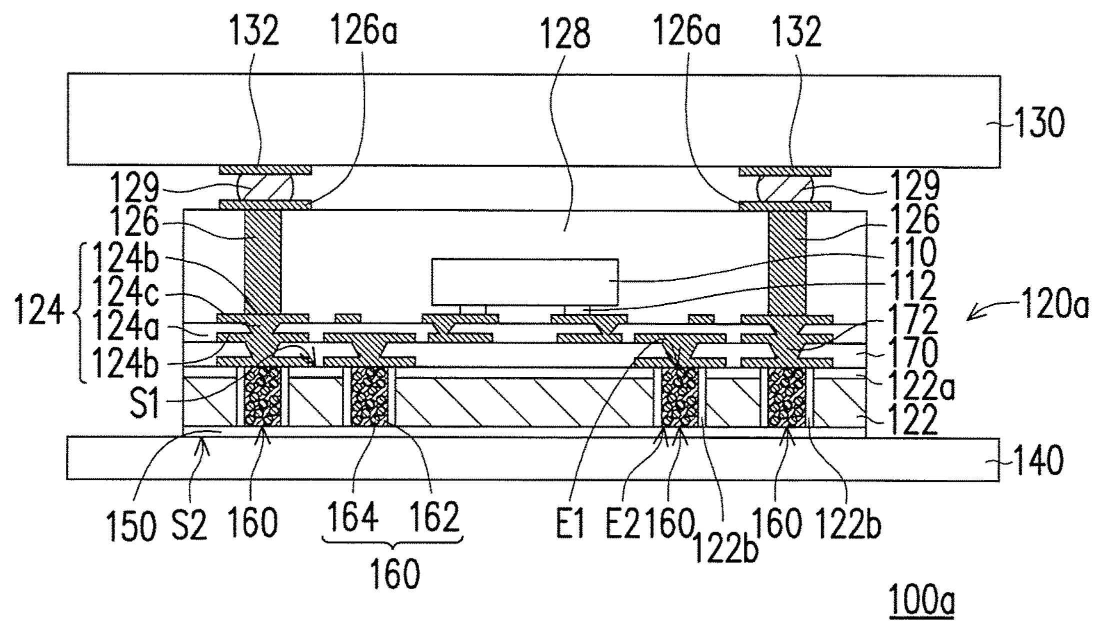
FIG. 4 is a schematic view of a chip package structure according to the third embodiment of the invention.

FIG. 4 is a schematic view of a chip package structure according to the third embodiment of the invention. Referring to FIG. 4, in this embodiment, a structure and a fabricating method of a chip package structure 100*a* are similar to the structure and fabricating method of the chip package structure 100 described above, and a main difference is that, in the chip package structure 100*a*, a carrier board 120*a* further includes a plurality of conductive vias 160 for enhancing the heat dissipation efficiency.

Specifically, in this embodiment, the chip package structure 100*a* includes a molding compound 128, the carrier board 120*a*, a chip 110, conductive pillars 126, and a circuit board 130, and a heat sink 140 may be connected through a thermal interface material 150 as required. Nevertheless, the invention is not limited thereto. Details regarding the molding compound 128 (including the chip 110, the conductive pillars 126, and the conductive bumps 129), the circuit board 130, the heat sink 140, and the thermal interface material 150 have been specified in the previous embodiment and thus are not repeated hereinafter. Further, the carrier board 120*a* includes a substrate 122 and a redistribution layer 124. Details regarding the substrate 122 and the redistribution layer 124 have been specified in the previous embodiment. Thus, a main difference between the carrier board 120*a* and the aforementioned carrier board 120 is that the carrier board 120*a* further includes the conductive vias 160. More specifically, the conductive vias 160 pass through the substrate 122 and connect the first surface S1 with the second surface S2. Preferably, each of the conductive vias 160 has a first end E1 and a second end E2, wherein the first end E1 is exposed on the first surface S1 of the substrate 122 to be even with the first surface S1 and connected with the redistribution layer 124, and the second end E2 is exposed on the second surface S2 of the substrate 122 to be even with the second surface S2 and connected with the heat sink 140 and the thermal interface material 150. Nevertheless, the invention is not limited thereto. A dielectric layer 170, which isolates the redistribution layer 124 from the substrate 122, and conductive holes 172, which pass through the dielectric layer 170 to communicate with the redistribution layer 124 and the conductive vias 160, may be further disposed on the first surface S1 of the substrate 122 and the redistribution layer 124. Nevertheless, the invention is not limited thereto. Moreover, if the substrate 122 is electrically conductive (for example, poly-silicon is used), a dielectric layer 122*b* is required between the substrate 122 and the conductive vias 160, so as to isolate the conductive vias 160 formed in the substrate 122.

Referring to FIG. 4, in this embodiment, the conductive vias 160 are disposed in the substrate 122 to improve the heat dissipation efficiency of the chip package structure 100*a*. Therefore, preferably, a thermal conductivity of the conductive vias 160 is greater than a thermal conductivity of the substrate 122. For example, the conductive vias 160 are formed by filling a highly thermal conductive metal into the substrate 122. Nevertheless, the invention is not limited thereto. Moreover, in this embodiment, each of the conductive vias 160 includes a solder pillar 162 and a plurality of metal balls 164 embedded in the corresponding solder pillar 162. Hereinafter, a structure and a fabricating method of the conductive vias 160 formed in the substrate 122 of the chip package structure 100*a* are described.

First, in this embodiment, the substrate 122 is provided with a plurality of blind holes recessed thereon, and a plurality of conductive balls are filled into the blind holes. If the substrate 122 is electrically conductive (for example, poly-silicon is used), a dielectric layer 122*b* is required to be disposed in the blind holes, so as to isolate conductive balls from the substrate 122 by the dielectric layer 122*b*. Each of the conductive balls includes the metal ball 164 (e.g., copper ball) and a solder layer covering the metal ball 164, wherein an outer diameter of each of the metal balls 164 is in a range of 0.5 μm to 100 μm, but the invention is not limited thereto. After that, the solder layers of the conductive balls are melted to form the solder pillars 162 in the corresponding blind holes, wherein a melting point of the metal balls 164 is higher than a melting point of the corresponding solder pillars 162, such that when the solder layers are melted to form the corresponding solder pillars 162, the metal balls 164 remain in a solid state and are embedded in the corresponding solder pillars 162. As such, each of the solder pillars 162 and the metal balls 164*s* embedded therein serve as the conductive via 160. An outer diameter D of each of the conductive vias 160 is in a range of 5 μm to 100 μm. Nevertheless, the invention is not limited thereto.

Thereafter, the first surface S1 and the second surface S2 of the substrate 122 are planarized, such that the first end E1 of each of the conductive vias 160 close to the first surface S1 is exposed on the first surface S1 of the substrate 122 to be even with the first surface S1, and the second end E2 of each of the conductive vias 160 close to the second surface S2 is exposed on the second surface S2 of the substrate 122 to be even with the second surface S2. A method of planarizing the first surface S1 and the second surface S2 of the substrate 122 includes chemical-mechanical polishing (CMP), but the invention is not limited thereto. The metal balls 164 close to the first surface S1 of the substrate 122 are cut to be even with the first surface S1 of the substrate 122, and the metal balls 164 close to the second surface S2 of the substrate 122 are cut to be even with the second surface S2 of the substrate 122. Nevertheless, the invention is not limited thereto. Moreover, if the substrate 122 is electrically conductive (for example, poly-silicon is used), the dielectric layer 122*a* is required to be disposed on the planarized first surface S1 of the substrate 122, so as to isolate the redistribution layer 124 that is to be formed on the first surface S1 of the substrate 122 in the subsequent process.

By the aforementioned steps, the process of fabricating the conductive vias 160 on the substrate 122 is completed, and this semifinished product is used in fabrication of the carrier board 120*a* and the chip package structure 100*a*. In the process of using the semifinished product in the fabrication of the carrier board 120*a* and the chip package structure 100*a*, the conductive pillars 126 may be disposed corresponding to the conductive vias 160. Nevertheless, the invention is not limited thereto. When the conductive vias 160 are formed by filling the conductive balls instead of the conventional electroplating, the production speed is increased.

Figure 5:
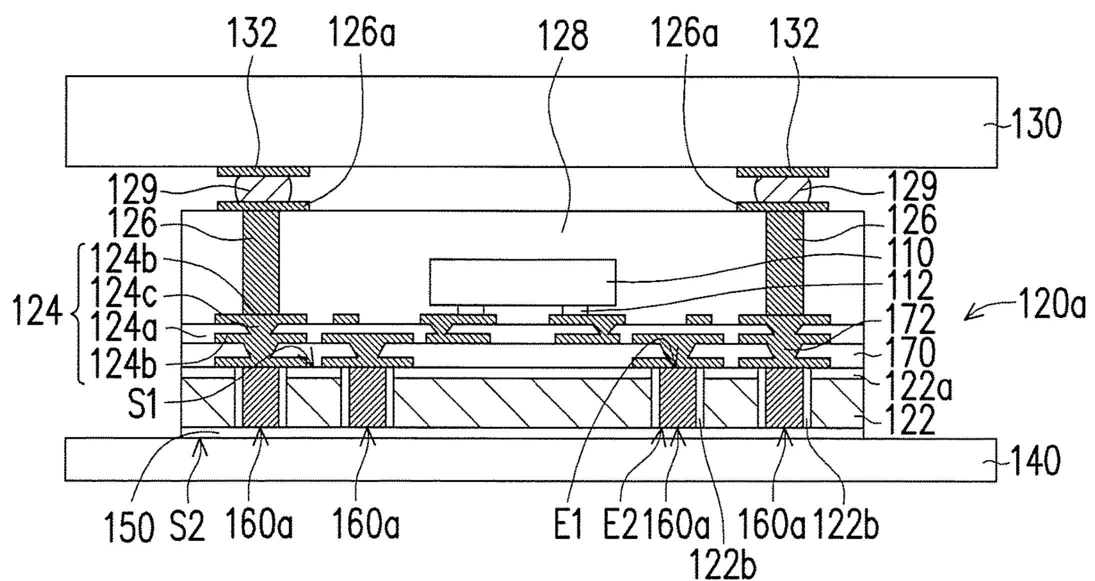
FIG. 5 is a schematic view of a chip package structure according to the fourth embodiment of the invention.

However, the aforementioned conductive vias 160 are merely one of the embodiments of the invention. FIG. 5 is a schematic view of a chip package structure according to the fourth embodiment of the invention. Referring to FIG. 5, in this embodiment, the conductive vias 160 shown in FIG. 4 may be replaced with the conductive vias 160*a*, wherein a thermal conductivity of the conductive vias 160*a* is greater than a thermal conductivity of the substrate 122. Specifically, each of the conductive vias 160*a* may be formed by filling a highly thermal conductive metal into the substrate 122, such as a metal pillar formed by an electroplating material electroplated in the recess by an electroplating process, and the first surface S1 and the second surface S2 of the substrate 122 are then planarized to expose the metal pillar serving as the conductive vias 160*a*. Nevertheless, the invention is not intended to limit the composition of the conductive vias 160 and 160*a*. Accordingly, the heat generated by the chip 110 during operation is transmitted through the substrate 122 and the conductive vias 160 or 160*a* from the first surface S1 to the second surface S2 and then dissipated through the heat sink 140. Accordingly, the chip package structure 100*a* achieves favorable heat dissipation efficiency.

Figure 6:
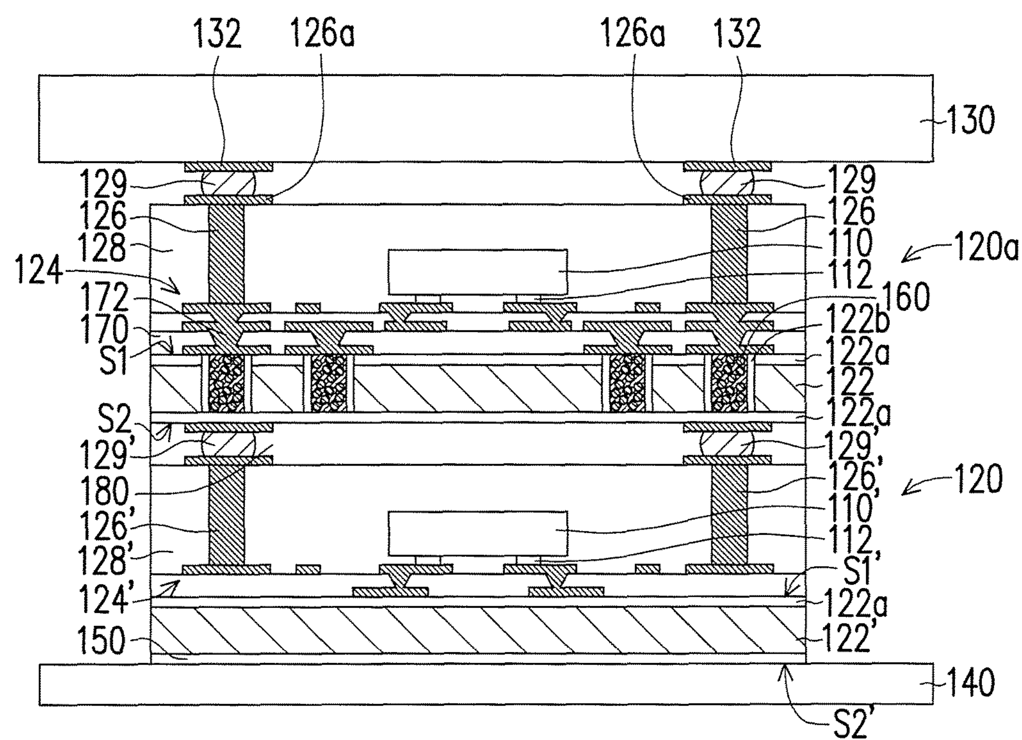
FIG. 6 is a schematic view of a chip package structure according to the fifth embodiment of the invention.

FIG. 6 is a schematic view of a chip package structure according to the fifth embodiment of the invention. Referring to FIG. 6, in this embodiment, a main difference between a chip package structure 100*b* and the aforementioned chip package structures 100 and 100*a* is that the chip package structure 100*b* includes two molding compounds 128 and 128' and two carrier boards 120*a* and 120. The chips 110 and 110' corresponding to the molding compounds 128 and 128' are respectively disposed on the redistribution layers 124 and 124' of the corresponding carrier boards 120*a* and 120 and are covered by the corresponding molding compounds 128 and 128', and the carrier boards 120*a* and 120 are electrically connected with each other and are connected with the circuit board 130, such that the chips 110 and 110' corresponding to the molding compounds 128 and 128' are located between the corresponding substrates 122 and 122' and the circuit board 130, and the chips 110 and 110' of the molding compounds 128 and 128' and the corresponding redistribution layers 124 and 124' are electrically connected with the circuit board 130 through the corresponding conductive pillars 126 and 126'.

Specifically, in this embodiment, the carrier board 120*a* and the corresponding molding compound 128 and chip 110 are fabricated together first, as described in the third embodiment of FIG. 4. The substrate 122 includes the conductive vias 160, which may be a combination of the aforementioned solder pillars 162 and metal balls 164 shown in FIG. 4. However, in other embodiment not shown here, the substrate 122 may include the conductive vias 160*a* formed by filling an electroplating material shown in FIG. 5. Nevertheless, the invention is not limited thereto. Likewise, the carrier board 120 and the corresponding molding compound 128' and chip 110' are fabricated together, as described in the first embodiment of FIG. 1. Thereafter, the carrier board 120*a* may be disposed on the circuit board 130 through the corresponding conductive bumps 129 and the carrier board 120 may be disposed on the carrier board 120*a* through the corresponding conductive bumps 129'. Moreover, the redistribution layer 124 on the carrier board 120*a* close to one side of the circuit board 130 and the corresponding chip 110 are electrically connected with the circuit board 130 through the corresponding conductive pillars 126 and the conductive bumps 129 while the redistribution layer 124' on the carrier board 120 away from one side of the circuit board 130 and the corresponding chip 110' are electrically connected with the carrier board 120*a* through the corresponding conductive pillars 126' and the conductive bumps 129' to be further connected with the circuit board 130 through the carrier board 120*a*.

Therefore, in this embodiment, the carrier boards 120 and 120*a* may be bonded by an underfill 180, wherein the underfill 180 is disposed on a bottom of the carrier board 120*a* (i.e., the second surface S2 of the substrate 122 of the carrier board 120*a*), and the conductive bumps 129' are embedded in the underfill 180 on a top of the carrier board 120 (i.e., a first surface S1' of the substrate 122' of the carrier board 120) to be connected with the conductive vias 160 (or the conductive vias 160*a*) formed on the carrier board 120*a*, such that the carrier boards 120 and 120*a* are electrically connected with each other. It is known from the above that the conductive vias 160 (or the conductive vias 160*a*) formed on the carrier board 120*a* not only help achieve the heat dissipation efficiency as described above but also electrically connect the carrier boards 120 and 120*a* that are stacked together. The composition and formation of the conductive vias 160 (or the conductive vias 160*a*) may be adjusted as required. In addition, in some other embodiments not shown here, the outermost carrier board 120 may also be provided with the conductive vias 160 (or the conductive vias 160*a*), like the carrier board 120*a*, to improve the heat dissipation efficiency. Details regarding the structure have been specified in the third embodiment of FIG. 4. Furthermore, the heat sink 140 may be disposed on the second surface S2' of the substrate 122' of the outermost carrier board 120. Nevertheless, the invention is not limited thereto.

Thus, the chip package structure 100*b* is a package on package (PoP) structure, also called a package stack structure, which uses multiple molding compounds 128 and 128' (including multiple chips 110 and 110') and multiple carrier boards 120 or 120*a*. In the chip package structure 100*b*, multiple carrier boards 120*a* and 120 including the chips 110 and 110' may be bonded by the underfill 180 and be electrically connected with one another through the corresponding conductive bumps 129 and 129' and the conductive vias 160 (or the conductive vias 160*a*) so as to achieve heat dissipation in the aforementioned manner. That is, the heat generated by the first chip 110 during operation is transmitted through the corresponding substrate 122 and the conductive vias 160 (or the conductive vias 160*a*) from the first surface S1 to the second surface S2 and then, together with the heat generated by the second chip 110' during operation, transmitted through the corresponding substrate 122' from the first surface S1' to the second surface S2' to be dissipated through the heat sink 140 (in some other embodiments not shown here, the substrate 122' may also be provided with the conductive vias 160 (or the conductive vias 160*a*) to improve the heat dissipation efficiency). Accordingly, the chip package structure 100*b* achieves favorable heat dissipation efficiency.

To sum up, in the chip package structure of the invention, the chip, the conductive pillars, and the redistribution layer of the carrier board are disposed on the first surface of the substrate of the carrier board and are covered by the molding compound, and then the circuit board is disposed on the molding compound, such that the chip is located between the substrate and the circuit board, and the chip and the redistribution layer are electrically connected with the circuit board through the conductive pillars. Moreover, the substrate may include a highly thermal conductive material, the conductive vias that have higher thermal conductivity than the substrate may be disposed on the substrate, or the heat sink may be disposed on the second surface of the substrate. Thus, according to the invention, as compared with the conventional technology in which the chip and the carrier board are sequentially disposed on the circuit board, the heat generated by the chip during operation is transmitted through the substrate from the first surface to the second surface to be dissipated and is not accumulated between the chip and the circuit board. Accordingly, the invention provides a chip package structure that achieves favorable heat dissipation efficiency.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A chip package structure, comprising:

at least one carrier board comprising a substrate and a redistribution layer, wherein the substrate has a first surface and a second surface opposite to each other, and the redistribution layer is disposed on the first surface of the substrate;

at least one chip disposed on the redistribution layer;

at least one conductive pillar disposed on the redistribution layer, wherein the at least one conductive pillar is located at a periphery of the at least one chip;

at least one molding compound disposed on the redistribution layer and covering the at least one chip, the at least one conductive pillar, and the redistribution layer, wherein the at least one conductive pillar passes through the at least one molding compound;

a circuit board disposed on the at least one molding compound, wherein the circuit board is connected with the at least one carrier board through the at least one conductive pillar, such that the at least one chip is located between the substrate and the circuit board, and the at least one chip and the redistribution layer are electrically connected with the circuit board through the at least one conductive pillar; and a heat sink disposed on the second surface of the substrate, wherein a size of the heat sink is larger than a size of the substrate, wherein the at least one carrier board further comprises conductive vias that pass through the substrate and connect the first surface with the second surface, wherein each of the conductive vias comprises a first end and a second end, and the first end is exposed on the first surface of the substrate to be even with the first surface and connected with the redistribution layer while the second end is exposed on the second surface of the substrate to be even with the second surface.

2. The chip package structure according to claim 1, wherein the substrate comprises a highly thermal conductive material.

3. The chip package structure according to claim 1, wherein the at least one molding compound further comprises at least one conductive bump that is disposed on the at least one conductive pillar and electrically connected with the circuit board.

4. The chip package structure according to claim 1, wherein a thermal conductivity of the conductive vias is greater than a thermal conductivity of the substrate.

5. The chip package structure according to claim 1, wherein each of the conductive vias comprises a solder pillar and a plurality of metal balls embedded in the corresponding solder pillar.

6. The chip package structure according to claim 1, wherein each of the conductive vias comprises a metal pillar.

7. The chip package structure according to claim 1, wherein the number of the at least one molding compound and the number of the at least one carrier board are multiple, the at least one chip of each of the multiple molding compounds is respectively disposed on the redistribution layer of corresponding one of the multiple carrier boards, and the multiple carrier boards are electrically connected with each other and connected with the circuit board, such that the at least one chip of each of the multiple molding compounds is located between the corresponding substrate and the circuit board, and the at least one chip of each of the multiple molding compounds and the corresponding redistribution layer are electrically connected with the circuit board through the corresponding conductive pillar.

* * * * *